United States Patent
Esposito

(10) Patent No.: US 11,134,569 B2
(45) Date of Patent: Sep. 28, 2021

(54) PCB TRANSFORMER

(71) Applicant: Frederic Vladimir Esposito, Luton (GB)

(72) Inventor: Frederic Vladimir Esposito, Luton (GB)

(73) Assignee: Eaton Intelligent Power Limited, Dublin (IE)

( * ) Notice: Subject to any disclaimer, the term of this patent is extended or adjusted under 35 U.S.C. 154(b) by 353 days.

(21) Appl. No.: 16/079,916

(22) PCT Filed: Jan. 25, 2017

(86) PCT No.: PCT/GB2017/050190
§ 371 (c)(1),
(2) Date: Aug. 24, 2018

(87) PCT Pub. No.: WO2017/144848
PCT Pub. Date: Aug. 31, 2017

(65) Prior Publication Data
US 2019/0075657 A1 Mar. 7, 2019

(30) Foreign Application Priority Data
Feb. 24, 2016 (GB) .................................... 1603209

(51) Int. Cl.
*H01F 27/24* (2006.01)
*H05K 1/16* (2006.01)
(Continued)

(52) U.S. Cl.
CPC .............. *H05K 1/165* (2013.01); *H01F 3/10* (2013.01); *H01F 27/24* (2013.01); *H01F 27/2804* (2013.01); *H01F 2027/2819* (2013.01)

(58) Field of Classification Search
CPC ........ H01F 3/10; H01F 27/24; H01F 27/2809; H01F 2027/2819; H05K 1/165
(Continued)

(56) References Cited

U.S. PATENT DOCUMENTS 5,353,001 A * 10/1994 Meinel ................ H01F 17/0006
336/83
6,359,542 B1 * 3/2002 Widmayer ............ H01F 27/266
336/210
(Continued)

FOREIGN PATENT DOCUMENTS

CN 102 360 852 A 2/2012
EP 2565882 A1 * 3/2013 ......... H01F 27/2804
(Continued)

OTHER PUBLICATIONS

International Search Report for PCT/GB2017/050190, dated Mar. 28, 2017, 3 pages.

*Primary Examiner* — Mang Tin Bik Lian
(74) *Attorney, Agent, or Firm* — Stinson LLP

(57) ABSTRACT

The present invention provides for a PCB transformer comprising a core and planar PCB winding, wherein the core has two legs extending from a table portion, and wherein a planar PCB winding extends around each of the said legs, and wherein the outer dimensions of the table portion in regions overlying the planar PCB windings match substantially the outer dimension of the planar PCB winding so as to achieve particularly efficient coupling between the winding and the core.

17 Claims, 6 Drawing Sheets

(51) Int. Cl.
*H01F 27/28* (2006.01)
*H01F 3/10* (2006.01)

(58) Field of Classification Search
USPC .................................. 336/212, 184, 220–221
See application file for complete search history.

(56) References Cited

U.S. PATENT DOCUMENTS

| | | | | |
|---|---|---|---|---|
| 6,867,678 B2* | 3/2005 | Yang | ................... | H01F 27/2804 336/200 |
| 7,432,793 B2* | 10/2008 | Nussbaum | .......... | H01F 17/0013 330/276 |
| 8,179,223 B2* | 5/2012 | Ohsawa | ............. | H01F 27/2847 336/221 |
| 8,427,269 B1* | 4/2013 | Vinciarelli | .............. | B29C 70/72 336/200 |
| 8,484,829 B2* | 7/2013 | Manoukian | ............. | H01F 5/003 29/602.1 |
| 10,468,181 B1* | 11/2019 | Vinciarelli | ............. | H05K 1/165 |
| 2012/0206060 A1* | 8/2012 | Beyer | ................. | H01F 27/2804 315/255 |
| 2013/0186995 A1 | 7/2013 | Yamaguchi et al. | | |
| 2015/0255204 A1* | 9/2015 | Yu | ........................... | H01F 17/06 336/220 |
| 2016/0078996 A1* | 3/2016 | Li | ...................... | H01F 27/2823 336/200 |
| 2016/0163445 A1* | 6/2016 | Bertels | .................... | H01F 27/08 381/397 |
| 2016/0336106 A1* | 11/2016 | Chung | ................. | H01F 17/0013 |
| 2017/0309395 A1* | 10/2017 | Shiraki | ................... | B60L 50/13 |

FOREIGN PATENT DOCUMENTS

| | | |
|---|---|---|
| EP | 2565882 A1 | 3/2013 |
| GB | 2 252 208 A | 7/1992 |
| JP | 2014056868 A | 3/2014 |

* cited by examiner

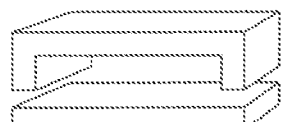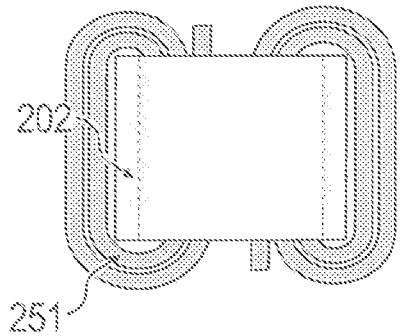
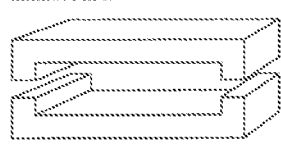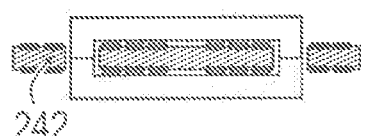
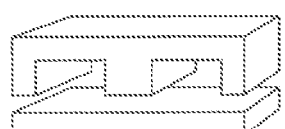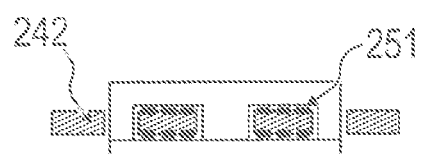
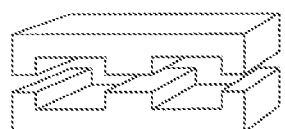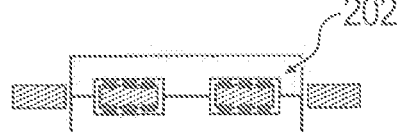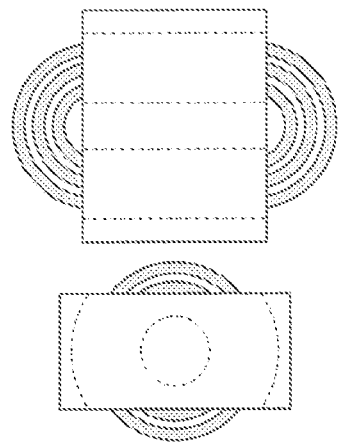
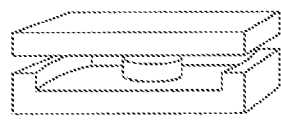
202　　　　　241　　　　　261
*Fig.3A*　　　*Fig.3B*　　　*Fig.3C*
PRIOR ART

PCB TRANSFORMER

CROSS-REFERENCE TO RELATED APPLICATIONS

This application is a National Stage Entry of, and claims priority to, PCT Patent Application No. PCT/GB2017/050190, filed Jan. 25, 2017, which claims priority to United Kingdom Patent Application No. GB1603209.6, filed Feb. 24, 2016, both of which are hereby incorporated by reference in their entirety.

The present invention relates in particular to a planar PCB transformer having planar PCB windings.

Various configurations of transformer are known with more traditional established configurations comprising primary and secondary wire windings extending in a helical manner along respective legs of an iron or ferrite transformer core. Such cores are commonly provided in U-U, U-I, E-E or E-I configuration. More recently, rather than extending along the legs in a helical manner, the windings have been provided in a planar manner as tracks on a PCB and which generally extend along a flat spiral track and generally concentric to a leg of the U-U, U-I, E-E or E-I core configuration.

Also, and as illustrated in FIGS. 6A-6E, various configuration transformer, different from PCB transformers of the present invention, are known and in which a central leg of the core is surrounded by an annular track within-which a coil will be located and enclosed by outer wall portions.

However, the design and configuration of the transformer core in relation to the dimensions, shape and general footprint of the planar PCB windings leads to limitations and disadvantages in known planar transformer design.

In particular, coupling of the magnetic flux is disadvantageously limited and the losses experienced by such known planar PCB transformers can prove significant.

The present invention seeks to provide for a planar PCB transformer having advantages over known such transformers.

In particular, the present invention seeks to provide for a planar PCB transformer having improved magnetic coupling efficiency and reduced losses.

According to one aspect of the present invention there is provided a PCB transformer comprising a core and planar PCB winding wherein the core has two legs that can be of substantially similar shape and size extending from a table, and wherein the planar PCB winding extends around at least one of the said legs, and wherein the outer dimensions of portions of the table overlying the planar PCB winding matches substantially the outer dimension of the planar PCB winding.

The invention proves particularly advantageous insofar as, with the respective outer dimensions of the winding and the outer dimensions of the table portion overlying the winding substantially matching, the invention provides for improved magnetic coupling, operational efficiency and reduced losses.

The shape and configuration of the core, is therefore more appropriate for use with the generally planar concentric PCB tracks forming the winding.

Advantageously, the magnetic coupling is arranged to take advantage, and be focussed on, the table portions of the transformer core, rather than the leg portions as with traditional transformer core design.

Advantageously, the respective dimensions of the said table portion and the winding match substantially over a major part of their peripheries.

In particular, there is substantial matching between the respective dimensions of the said table portion and the winding in all regions except for the region of the table extending between two neighbouring legs.

Advantageously, it will be appreciated that the footprint of the table portion overlying the winding is arranged to correspond substantially to the footprint of the winding.

The size and shape of the portion of the table overlying the winding is arranged to mirror the shape and configuration of the winding with the exception of a region extending between two neighbouring legs.

Advantageously, the respective windings extend around the two legs. As an alternative, the PCB transformer can comprise a central leg and two peripheral legs and a single winding can be centred on the said central leg.

In such a manner, the said table portion in a region overlying the winding is centred on the at least one leg.

In particular, the invention hereby provides for a PCB transformer including a core having two legs and respective first and second planar windings extending around the respective first and second legs of the core.

In another embodiment, a PCB transformer of the present invention can include a core comprising three legs and a planar winding extending around a central one of the three legs.

In particularly, the first and second windings can comprise matching pairs of windings.

In particular, the region of the table of the core extending above the pair of windings, and the pair of windings, comprises a "figure of 8" footprint.

The invention is described further hereinafter, by way of example only, with reference to the accompanying drawings in which:

FIG. 3A is a perspective view of four different examples of transformer core according to known planar transformer designs;

FIG. 3B is a cross-sectional view of the cores of FIG. 3A showing the location of the PCB and transformer coil tracks in that planar arrangement;

FIG. 3C are plan views of the two leg and three leg transformer cores and coils of FIG. 3B;

Figure 5A:
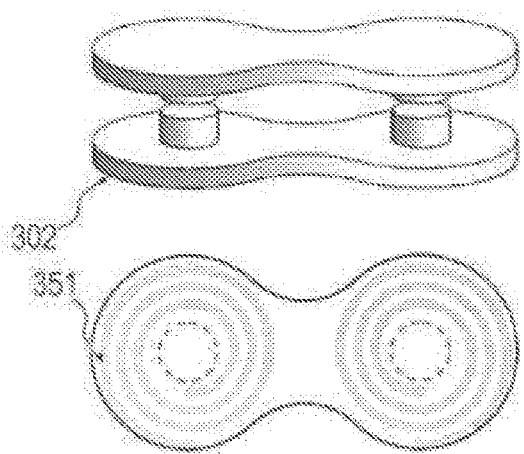

FIG. 5A provides perspective and plan representations of a transformer core and PCB transformer according to one embodiment of the present invention.

Figure 5B:
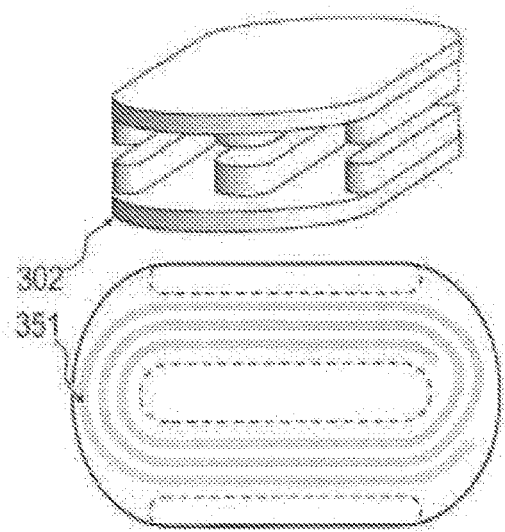

FIG. 5B provides a schematic perspective view and plan view of a PCB transformer core and PCB windings according to another embodiment of the present invention.

Figure 5C:
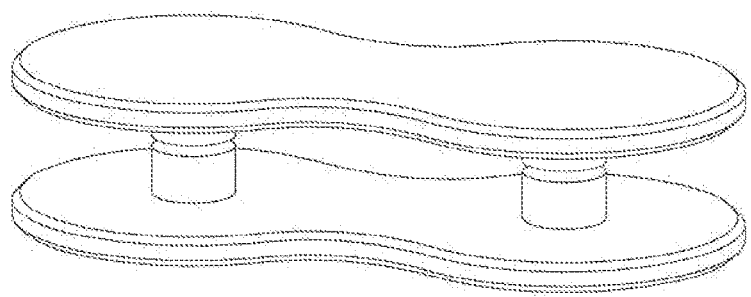
Figure 6A:
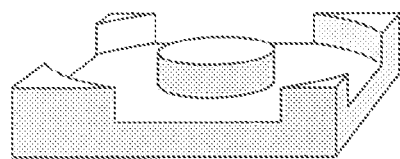
Figure 6B:
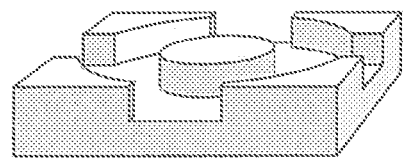
Figure 6C:
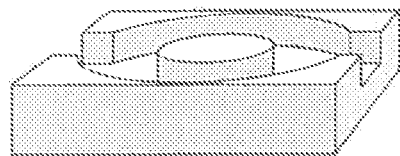
Figure 6D:
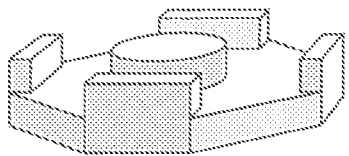
Figure 6E:
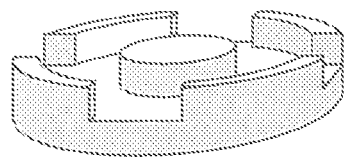

FIG. 5C provides a perspective view of a transformer core and PCB transformer according to another embodiment of the present invention.

FIGS. 6A through 6E are perspective views of five different known transformer configurations.

Figure 1A:
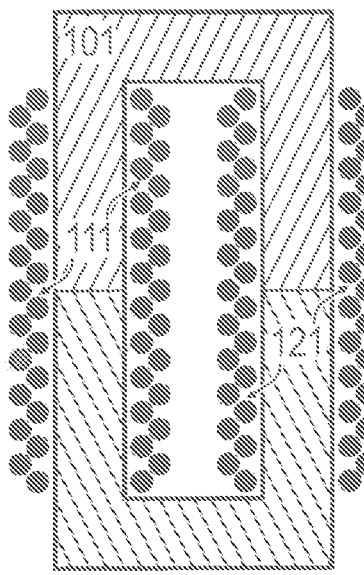
FIGS. 1A and 1B are cross-sectional views through two different examples of known transformer cores and associated coils.

Turning now to FIG. 1A, there is provided a cross-sectional view through a traditional transformer comprising a U-U configuration transformer core formed of iron or ferrite 101 and having a primary transformer winding 111 wound in a helical manner around one of the transformer legs, and a secondary winding 121 extending in a similar manner around a second of the two transformer core legs.

Figure 1B:
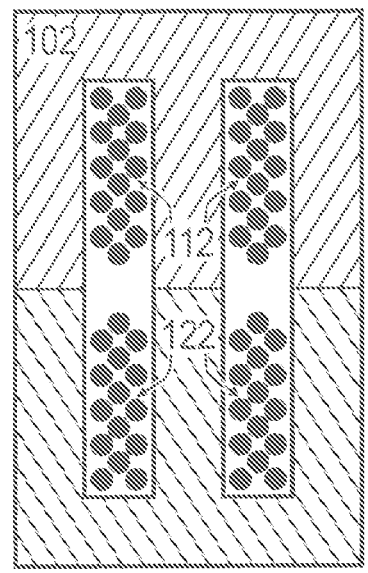

FIG. 1B illustrates a further example of a known transformer core 102, this time comprising a three legged, or E-E core in which both primary 112, and a secondary 122, transformer windings extend around, and along, the central leg of the transformer core 102.

Figure 2A:
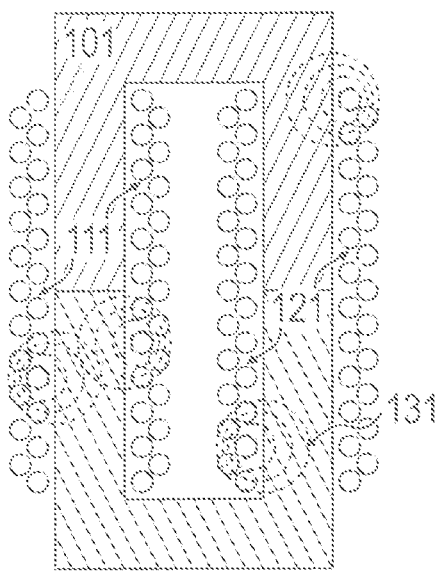
FIGS. 2A and 2B are schematic representations of the transformer cores of FIGS. 1A and 1B showing the magnetic flux lines produced by the coils.
Figure 2B:
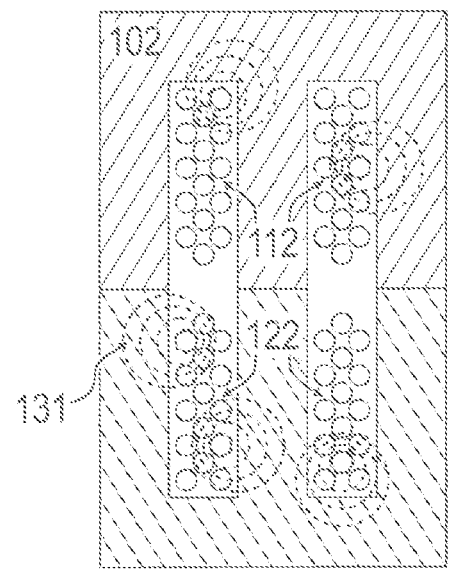

Similar sectional views of the transformer U-U and E-E cores of FIG. 1A and FIG. 1B are illustrated in FIG. 2A and FIG. 2B, but in FIG. 2A and FIG. 2B the magnetic field indicated by magnetic flux lines 131 is illustrated in relation to transformer core windings. As will be appreciated, with the transformer windings extending along the legs of the transformer coils 101, 102, and so a substantial amount of the magnetic flux coupling is by way of the iron/ferrite core 101, 102 which offers the least resistance to the magnetic path 131.

As an alternative to the known transformer designs of FIGS. 1A, 1B, 2A and 2B, planar transformers are also well known in which planar PCB winding tracks are provided in place of the known helical transformer windings and which extend generally concentrically around the legs of the transformer core and in a plane parallel to the table portion of the transformer core.

Different configurations of two-part transformer core design are known 202 as illustrated in FIG. 3A and which illustrate U-I and U-U versions of a two legged planar transformer core, and E-I and E-E versions of a three legged planar transformer core.

The overall transformer structure 241 is illustrated with reference to FIG. 3B and which also illustrates the PCB 242 extending through the planar transformer core 202 and with printed windings 251 provided thereon.

Further detail of such PCB transformer designs are illustrated with reference to FIG. 3C which show typical planar configurations of the two legged planar transformer core and three leg planar transformer core; the two leg planar transformer core employing concentric tracks for windings extending around each of the two legs, wherein the three leg planar transformer core employs PCB winding tracks extending generally concentrically around the centre of the three legs.

Figure 4A:
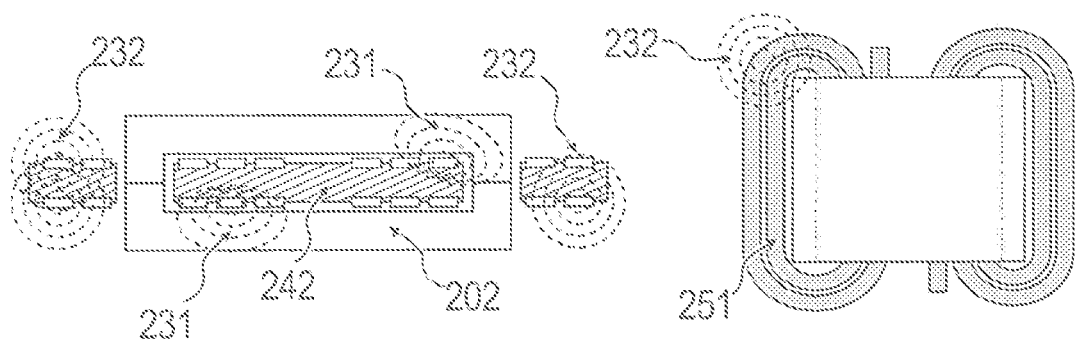
FIG. 4A illustrates schematic cross-sectional and plan views of the operation of a PCB transformer according to known transformer designs and showing lines of magnetic flux.
Figure 4B:
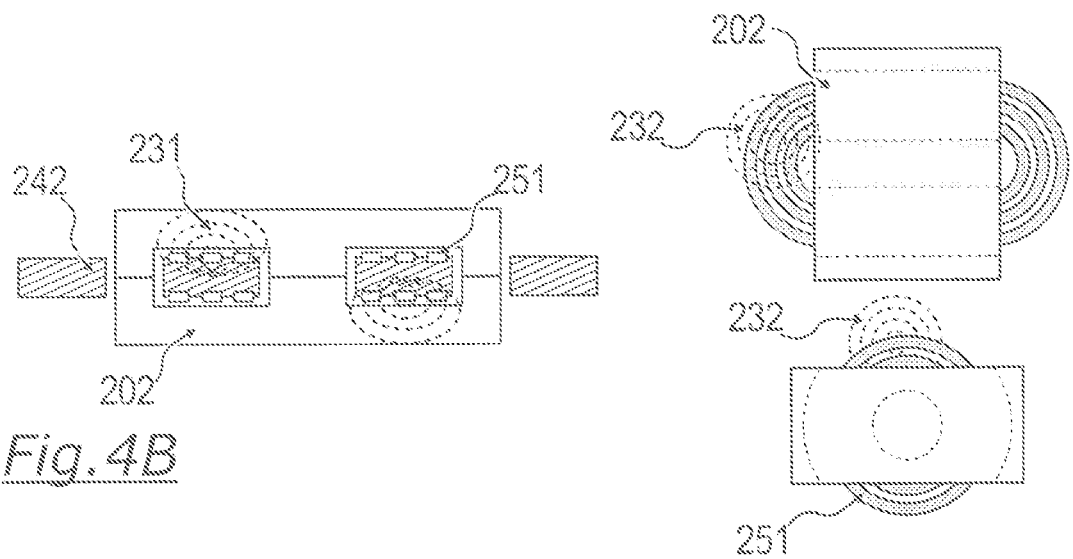
FIG. 4B illustrates a different embodiment to that of FIG. 4A.

Referring now to FIGS. 4A and 4B there are provided schematic views of the two legged U-U planar PCB core of FIG. 3A, 3B, 3C, and the three legged E-E planar core configuration of FIGS. 3A, 3B and 3C but, as with FIGS. 2A and 2B, also illustrating the lines of flux 231, 232 arising from the PCB tracks.

As will be appreciated, some of the lines of flux 231 extend through the magnetic media provided by the planar core 202, wherein regions of magnetic flux 232 do not couple through the magnetic core and so lead to disadvantageous and particularly undesirable, losses and overall inefficiencies in magnetic coupling within the transformer.

FIGS. 4A and 4B also illustrate the windings 251 provided on the PCB 242.

Turning now however to FIG. 5A, there is provided a perspective view of a two-legged planar transformer core according to a PCB transformer embodying one aspect of the present invention and also a planar view of the footprint offered by the planar winding of the embodiment of the present invention and as corresponding to the footprint of the PCB tracks comprising the planar and spirally extending winding tracks.

As will be appreciated, the two-legged transformer core 302 illustrated in FIG. 5A has the general appearance of a chain-link, or substantially figure-of-eight configuration, and when forming part of a completed PCB transformer, in plan view, overlies the twin PCB tracks 351 forming the transformer windings in the major part of the outer periphery of the PCB tracks. That is, it is generally only the portion of the table extending laterally relative to the legs, and between the two legs, that does not follow the outer dimensions and configuration of the underlying PCB windings 351.

A further example of an embodiment of the present invention is illustrated with reference to FIG. 5B which again shows a perspective view of a planar transformer coil 302 embodying the present invention but in this example comprising a three legged E-E planar transformer core. As will be appreciated, this particular example of an embodiment of the invention employs a core with a central leg, and two peripheral legs and that are substantially similar in size and shape.

The plan view of a completed PCB transformer is also provided in FIG. 5B and wherein the general shape and configuration of the table of the PCB planar transformer core generally mirrors, or corresponds to the generally "race track" configuration of the PCB windings forming the transformer coil 351.

In this example of the three-legged transformer core, the PCB tracks extend only around the central of the three legs and, again, the manner in which the footprint of the planar core mirrors, or substantially matches, that of the PCB winding tracks is clearly illustrated.

Referring to FIG. 5C, a further variant of the illustrated embodiment can comprise a table having a thickness that varies. For example, a degree of tapering can be provided whereby the table is progressively thinner at edge regions. This can be achieved without detriment since less flux density is present, thus reducing the amount of ferrite where it is not necessary.

In particular, and with the table exhibiting a configuration wider at each end, such as for example a figure of eight type configuration, the tapering at the edge regions of the table is such that it is progressively thinner only at the end regions and not in the middle region. Such tapering could then be provided around about ¾ of the arc of the end regions of the figure of eight configuration.

According to the invention therefore, the disadvantages of the known art in which a substantial part of the windings are spaced from the magnetic media, and wherein losses are significant, is therefore avoided so as to greatly enhance the efficiency and manner of operation of planar transformers.

The invention is therefore notably advantageously directed to providing a shape of core which is more appropriate for use in relation to planar PCB windings, and wherein the height of the coil legs is minimized, and the shape of the core tables optimised to cover the totality of the PCB tracks, but without unnecessarily extending beyond the lateral periphery of the PCB windings. This advantageously offers a short distance and path of least resistant magnetic path for channelling the magnetic flux in a particularly efficient manner.

Greater efficiencies are therefore produced by way of the present invention.

It should of course be appreciated that the invention is not restricted to the details of the forgoing embodiment insofar as any appropriate shape configuration of planar transformer core can be provided, when considered in plan view, and with any appropriate number of legs, and correspondingly appropriate dimensions of PCB coil tracks can likewise be provided, in any required number, and so as to substantially match, and thereby generally correspond in footprint, to the planar transformer coil.

Of course, the PCB can be formed from any appropriate material, and to have one a various possible properties, such as rigidity and flexibility.

The invention claimed is:

1. A panel circuit board (PCB) transformer comprising:
   a transformer core having a table and two legs extending from the table, and
   planar PCB windings extending around each of the two legs,
   wherein outer dimensions of portions of the table overlying the planar PCB windings match substantially with outer dimensions of the planar PCB;
   windings in all regions except for a region of the table extending between the two legs;
   wherein edge regions of the table are tapered so that the table is progressively thinner at the edge regions; and
   wherein the edge regions are tapered only where the outer dimensions of portions of the table overlying the planar PCB windings match substantially with the outer dimensions of the planar PCB windings.

2. The PCB transformer of claim 1, wherein magnetic coupling in the PCB transformer is configured to be focused on the table of the transformer core.

3. The PCB transformer of claim 1, wherein a footprint of the portions of the table overlying the planar PCB windings is arranged to correspond substantially to a footprint of the planar PCB windings.

4. The PCB transformer of claim 1, wherein a size and shape of the portions of the table overlying the planar PCB winding is arranged to mirror the shape and configuration of the planar PCB winding with the exception of the region of the table extending between the two legs.

5. The PCB transformer of claim 1, wherein each of the planar PCB windings is centered on one of the two legs.

6. The PCB transformer of claim 5, wherein the portions of the table overlying the planar PCB winding are centered on each of the two legs.

7. The PCB transformer of claim 1, wherein the transformer core includes an additional table with the two legs extending between the table and the additional table.

8. The PCB transformer of claim 7, wherein the table and the additional table have substantially the same shape.

9. The PCB transformer of claim 1, wherein the two legs have substantially the same shape.

10. The PCB transformer of claim 1, wherein the portions of the table overlying the planar PCB windings define a figure-of-eight footprint for the table.

11. The PCB transformer of claim 1, wherein the table has only the two legs.

12. A PCB transformer comprising:
    a transformer core having a table, a central leg extending from a central region of the table, and two peripheral legs extending from peripheral regions of the table, and
    a planar PCB winding extending around the central leg,
    wherein outer dimensions of a portion of the table overlying the planar PCB winding matches substantially with outer dimensions of the planar PCB;
    winding in all regions except for the region of the table extending between the central leg and the two peripheral legs,
    wherein edge regions of the table are tapered so that the table is progressively thinner at the edge regions,
    wherein the edge regions are tapered only where the outer dimensions of portions of the table overlying the planar PCB winding match substantially with the outer dimensions of the planar PCB winding.

13. The PCB transformer of claim 12, wherein a footprint of the portion of the table overlying the planar PCB winding is arranged to correspond substantially to a footprint of the planar PCB winding.

14. The PCB transformer of claim 12, wherein the central leg has substantially the same shape and size as the two peripheral legs.

15. The PCB transformer of claim 12, wherein the portion of the table overlying the planar PCB winding defines a lozenge shape for the table.

16. The PCB transformer of claim 12, wherein the transformer core includes an additional table with the central and two peripheral legs extending between the table and the additional table.

17. The PCB transformer as claimed in claim 16, wherein the table and the additional table have substantially the same shape.

* * * * *